United States Patent
McClean et al.

(10) Patent No.: US 12,261,627 B2
(45) Date of Patent: Mar. 25, 2025

(54) DECODING ERRORS USING QUANTUM SUBSPACE EXPANSION

(71) Applicant: Google LLC, Mountain View, CA (US)

(72) Inventors: Jarrod Ryan McClean, Marina Del Rey, CA (US); Ryan Babbush, Venice, CA (US); Zhang Jiang, El Segundo, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/473,029

(22) Filed: Sep. 22, 2023

(65) Prior Publication Data
US 2025/0030440 A1    Jan. 23, 2025

Related U.S. Application Data

(62) Division of application No. 17/433,459, filed as application No. PCT/US2020/021236 on Mar. 5, 2020, now Pat. No. 11,894,860.
(Continued)

(51) Int. Cl.
*H03M 13/00*     (2006.01)
*G06N 10/00*     (2022.01)
*H03M 13/15*     (2006.01)

(52) U.S. Cl.
CPC ........ *H03M 13/1575* (2013.01); *G06N 10/00* (2019.01)

(58) Field of Classification Search
None
See application file for complete search history.

(56) References Cited

U.S. PATENT DOCUMENTS

| 7,037,807 B1 | 5/2006 | Murakami et al. |
| 10,311,370 B2 * | 6/2019 | Bravyi ............... G06F 17/16 |

(Continued)

FOREIGN PATENT DOCUMENTS

| CN | 101366183 | 2/2009 |
| CN | 103067093 | 4/2013 |

(Continued)

OTHER PUBLICATIONS

Notice of Allowance in Japanese Appln. No. 2023-002459, mailed on May 13, 2024, 5 pages (with English translation).
(Continued)

*Primary Examiner* — Mujtaba M Chaudry
(74) *Attorney, Agent, or Firm* — Fish & Richardson P.C.

(57) ABSTRACT

Methods, systems and apparatus for correcting a result of a quantum computation. In one aspect, a method includes selecting a quantum error correcting code for the quantum computation, wherein the quantum error correcting code is defined by multiple stabilizer generators; determining a set of symmetry operators, comprising: selecting a subset of the stabilizer generators, determining, for each selected stabilizer generator, a sum between an identity operator and the stabilizer generator, and multiplying the determined sums together to form a summation of terms, wherein each term in the summation is equal to a respective symmetry operator; measuring a projective correction of a physical observable over an output quantum state of the quantum computation using the determined set of symmetry operators, wherein the physical observable corresponds to the result of the quantum computation; and determining a corrected result of the quantum computation using the measured projective correction of the physical observable.

9 Claims, 4 Drawing Sheets

Related U.S. Application Data

(60) Provisional application No. 62/814,155, filed on Mar. 5, 2019.

(56) References Cited

U.S. PATENT DOCUMENTS

| | | | |
|---|---|---|---|
| 10,352,992 | B1* | 7/2019 | Zeng ................... G06N 10/00 |
| 11,037,068 | B2* | 6/2021 | Girvin ................. G06F 11/322 |
| 11,106,980 | B2 | 8/2021 | Kapit |
| 11,334,693 | B1 | 5/2022 | Flammia |
| 11,449,384 | B2* | 9/2022 | Rosenblum ......... G06F 11/1004 |
| 11,550,977 | B2* | 1/2023 | Daraeizadeh ......... G11C 29/52 |
| 11,635,456 | B2* | 4/2023 | Ofek .................... G06F 9/5027 |
| | | | 702/66 |
| 2011/0313741 | A1 | 12/2011 | Langhoff |
| 2014/0118023 | A1 | 5/2014 | Eastin |
| 2015/0339417 | A1* | 11/2015 | Garcia-Ramirez ..... G06F 17/16 |
| | | | 703/2 |
| 2017/0364362 | A1 | 12/2017 | Lidar et al. |
| 2019/0042392 | A1 | 2/2019 | Matsuura et al. |
| 2019/0080254 | A1* | 3/2019 | Haah .................. H04L 9/0858 |
| 2020/0027971 | A1 | 1/2020 | Freedman et al. |
| 2020/0401927 | A1* | 12/2020 | Nickerson .............. G06F 15/16 |

FOREIGN PATENT DOCUMENTS

| | | |
|---|---|---|
| CN | 108599924 | 9/2018 |
| CN | 109257166 | 1/2019 |
| JP | 2006-345324 | 12/2006 |
| JP | 2009-165049 | 7/2009 |
| JP | 2015-534410 | 11/2015 |
| WO | WO 2020181116 | 9/2020 |

OTHER PUBLICATIONS

Babbush et al., "Encoding electronic spectra in quantum circuits with linear t complexity" Physical Review, 2018, 36 pages.
Babbush et al., "Low-depth quantum simulation of materials" Physical Review, 2018, 40 pages.
Boixo et al., "Characterizing quantum supremacy in near-term devices" arXiv, 2016, 23 pages.
Bombin, "Single-shot fault-tolerant quantum error correction" Physical Review, 2015, 26 pages.
Bonet-Monroig et al., "Low-cost error mitigation by symmetry vertification" Physical Review, 2018, 10 pages.
Bravyi et al., "Tapering off qubits to simulate fermionic hamiltonians" arXiv, 2017, 15 pages.
Campbell, "A theory of single-shot error correction for adversarial noise" Quantum Science and Technology, 2019, 30 pages.
Colless et al., "Computation of molecular spectra on a quantum processor with an error-resilient algorithm" Physical Review, 2018, 7 pages.
Colless et al., "Robust determination of molecular spectra on a quantum processor" arXiv, 2017, 12 pages.
Dumitrescu et al., "Cloud quantum computing of an atomic nucleus" Phys. Rev. Lett., 2018, 6 pages.
Endo et al., "Practical quantum error mitigation for near-future applications" Physical Review, 2018, 21 pages.
Extended European Search Report in European Appln. No. 23204399. 2, mailed on Jan. 31, 2024, 17 pages.
Farhi et al., "A quantum approximate optimization algorithm" arXiv, 2014, 16 pages.
Farhi et al., "Classification with quantum neural networks on near term processors" arXiv, 2018, 21 pages.
Feynman, "Simulating physics with computers" Journal of Theoretical Physics, 1982, 22 pages.
Gottesman, "Stabilizer codes and quantum error correction" arXiv, 1997, 122 pages.
Hempel et al., "Quantum chemistry calculations on a trapped-ion quantum simulator" Physical Review, 2018, 22 pages.

International Preliminary Report on Patentability in International Application No. PCT/US2020/021236, mailed on Sep. 16, 2021, 15 pages.
International Search Report and Written Opinion in International Application No. PCT/US2020/021236, mailed on Jun. 19, 2020, 21 pages.
Iyer et al., "A small quantum computer is needed to optimize fault-tolerant protocols" Quantum Science and Technology, 2018, 16 pages.
Jiang et al., "Majorana loop stabilizer codes for error correction of fermionic quantum simulations" arXiv, 2018, 13 pages.
Kandala et al., "Hardware-efficient variational quantum eigensolver for small molecules and quantum magnets" arXiv, 2017, 24 pages.
Kivlichan et al., "Quantum simulation of electronic structure with linear depth and connectivity" arXiv, 2018, 8 pages.
Li et al., "Efficient variational quantum simulator incorporating active error minimization" Physical Review, 2017, 14 pages.
McArdle et al., "Error mitigated digital quantum simulation" Physical Review, 2019, 6 pages.
McClean et al., "Barren plateaus in quantum neural network training landscapes" Nature, 2018, 6 pages.
McClean et al., "Hybrid quantum-classical hierarchy for mitigation of decoherence and determination of excited states" Physical Review, 2017, 10 pages.
McClean et al., "The theory of variational hybrid quantum-classical algorithms" New Journal of Physics, 2016, 23 pages.
Motta et al., "Low rank representations for quantum simulation of electronic structure" arXiv, 2018, 8 pages.
Motta et al., "Quantum imaginary time evolution, quantum lanczos, and quantum thermal averaging" arXiv, 2019, 15 pages.
Neill et al., "A blueprint for demonstrating quantum supremacy with superconducting qubits" arXiv, 2017, 22 pages.
Notice of Acceptance in Australian Appln. No. 2020232777, mailed on Nov. 23, 2022, 3 pages.
Notice of Allowance in Australian Appln. No. 2022256129, mailed on Aug. 18, 2023, 3 pages.
Notice of Allowance in Australian Appln. No. 2022256137, mailed on Jul. 4, 2023, 3 pages.
Notice of Allowance in European Appln. No. 20717004.4, mailed on Aug. 17, 2023, 9 pages.
Office Action in Australian Appln. No. 2020232777, mailed on Aug. 11, 2022, 5 pages.
Office Action in Australian Appln. No. 2022256129, mailed on May 31, 2023, 2 pages.
Office Action in Australian Appln. No. 2022256137, mailed on May 31, 2023, 2 pages.
Office Action in Canadian Appln. No. 3128993, mailed on Dec. 16, 2022, 6 pages.
Office Action in Japanese Appln. No. 2021-552654, mailed on Dec. 12, 2022, 5 pages (with English translation).
Office Action in Japanese Appln. No. 2023-002459, mailed on Jan. 22, 2024, 4 pages (with English translation).
O'Malley et al., "Scalable quantum simulation of molecular energies" Physical Review, 2016, 13 pages.
Otten et al., "Accounting for errors in quantum algorithms via individual error reduction" arXiv, 2018, 7 pages.
Parrish et al., "Quantum computation of electronic transitions using a variational quantum eigensolver" arXiv, 2019, 13 pages.
Peruzzo et al., "A variational eigenvalue solver on a photonic quantum processor" Nature, 2014, 7 pages.
Preskill, "Quantum Computing in the NISQ era and beyond" arXiv, 2018, 20 pages.
Romero et al., "Strategies for quantum computing molecular energies using the unitary coupled cluster ansatz" ar Xiv, 2018, 18 pages.
Rubin et al., "Application of fermionic marginal constraints to hybrid quantum algorithms" arXiv, 2018, 24 pages.
Sagastizabal et al., "Error mitigation by symmetry verification on a variational quantum eigensolver" arXiv, 2019, 13 pages.
Santagati et al., "Witnessing eigenstates for quantum simulation of hamiltonian spectra" Science Advances, 2018, 12 pages.

(56) References Cited

OTHER PUBLICATIONS

Sawaya et al., "Error sensitivity to environmental noise in quantum circuits for chemical state preparation" Journal of Chemical Theory and Computation, 2016, 12 pages.
Setia et al., "Bravyi-kitaev superfast simulation of electronic structure on a quantum computer" Journal of Chemical Physics, 2018, 14 pages.
Shen et al., "Quantum implementation of the unitary coupled cluster for simulating molecular electronic structure" Physical Review, 2017, 5 pages.
Temme et al., "Error mitigation for short-depth quantum circuits" arXiv, 2017, 15 pages.
Tuckett et al., "Ultra-high error threshold for surface codes with biased noise" Physical Review, 2018, 5 pages.
Notice of Allowance in Australian Appln. No. 2023243054, mailed on Nov. 1, 2024, 3 pages.
Office Action in Chinese Appln. No. 202080018782.5, mailed on Nov. 11, 2024, 11 pages (with Machine English translation).

\* cited by examiner

DECODING ERRORS USING QUANTUM SUBSPACE EXPANSION

CROSS-REFERENCE TO RELATED APPLICATIONS

This application is a divisional application of, and claims priority to, U.S. patent application Ser. No. 17/433,459, filed on Aug. 24, 2021, which application is a National Stage Application under 35 U.S.C. § 371 and claims the benefit of International Application No. PCT/US2020/021236, filed Mar. 5, 2020, which claims priority to U.S. Application No. 62/814,155, filed Apr. Mar. 5, 2019. The disclosures of the foregoing applications are incorporated herein by reference in their entirety for all purposes.

BACKGROUND

This specification relates to quantum computing.

Quantum error correction codes are used in quantum computing to protect quantum information from errors due to decoherence and other quantum noise. Some quantum error correction codes employ syndrome measurements to diagnose errors that corrupt a quantum state. Syndrome measurements are multi-qubit measurements of respective check operators that do not disturb the quantum information in the encoded state. The outcome of a syndrome measurement—the error syndrome—can be used as a part of a fast feedback mechanism to decode and recover from the error. For example, a unitary recovery operator can be applied to the quantum state conditioned on the error syndrome to stop errors propagating through the computation.

SUMMARY

This specification describes methods and systems for mitigating and decoding errors on logical qubits using a post processing technique based on quantum subspace expansions.

In general, one innovative aspect of the subject matter described in this specification can be implemented in a method for correcting a result of a quantum computation, the method comprising: selecting a quantum error correcting code to perform the quantum computation, wherein the quantum error correcting code is defined by a respective set of stabilizer generators; determining a set of symmetry operators, comprising: selecting a subset of the set of stabilizer generators; determining, for each stabilizer generator in the selected subset, a sum between an identity operator and the stabilizer generator; and multiplying the determined sums together to form a summation of terms, wherein each term in the summation is equal to a respective symmetry operator; measuring a projective correction of a physical observable over an output quantum state of the quantum computation using the determined set of symmetry operators, wherein the physical observable corresponds to the result of the quantum computation; and determining a corrected result of the quantum computation using the measured projective correction of the physical observable.

Other implementations of these aspects include corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations measuring the projective correction of a physical observable over an output quantum state of the quantum computation using the determined set of symmetry operators comprises measuring $\bar{P}^\dagger \gamma \bar{P}$ where $\bar{P}$ represents a summation of the symmetry operators in the determined set of symmetry operators with uniform coefficients, and $\Gamma$ represents the physical observable.

In some implementations measuring a projective correction of a physical observable over an output quantum state of the quantum computation using the determined set of symmetry operators comprises: selecting one or more pairs of operators, wherein each pair comprises i) a respective component of the physical observable, and ii) a respective symmetry operator from the determined set of symmetry operators; for each selected pair of operators: performing the quantum computation on an initial quantum state to obtain the output quantum state, and measuring the selected pair of operators over the output quantum state to obtain a respective measurement result.

In some implementations determining a corrected result of the output of the quantum computation comprises determining a corrected result of the output of the quantum computation using the obtained measurement results.

In some implementations determining a corrected result of the output of the quantum computation using the obtained measurement results comprises computing a linear combination of the obtained measurement results.

In some implementations selecting one or more pairs of operators comprises randomly sampling one or more pairs of operators according to a stochastic sampling scheme.

In some implementations the result of the quantum computation comprises an expectation value of the physical observable.

In some implementations the physical observable comprises a weighted sum of Pauli operators, and wherein components of the physical observable comprise Pauli operators in the sum of Pauli operators.

In some implementations measuring a selected pair of operators over the output quantum state to obtain a respective measurement result comprises measuring $\gamma_j M_k$ over the output quantum state, wherein $\Gamma_j$ represents the component of the physical observable in the selected pair and $M_k$ represents the symmetry operator in the selected pair.

In some implementations the size of the selected subset of the set of stabilizer generators is dependent on one or more of i) a target computation accuracy, or ii) a target computation cost.

In some implementations the quantum code comprises a stabilizer code, surface code, the Shor code, the Bacon-Shor code, or toric code.

In some implementations the quantum computation is performed using a noisy intermediate scale quantum computer.

In general, another innovative aspect of the subject matter described in this specification can be implemented in a method for correcting a result of a quantum computation, the method comprising: selecting a quantum error correcting code to perform the quantum computation, wherein the quantum error correcting code is defined by a respective set of stabilizer generators; selecting a linear combination of stabilizer operators generated by the stabilizer generators; determining values of coefficients of the stabilizer operators in the linear combination, comprising solving a generalized eigenvalue problem for a corresponding quantum error correcting code Hamiltonian; measuring an expansion correction of a physical observable over an output quantum state of the quantum computation using the stabilizer operators in the linear combination of stabilizer operators, wherein the physical observable corresponds to the result of the quantum computation; and determining a corrected result of the quantum computation using the measured expansion correction of the physical observable and the determined values of the coefficients of the stabilizer operators in the linear combination.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations solving the generalized eigenvalue problem comprises: preparing multiple copies of an output quantum state of the quantum computation; measuring components of the quantum error correcting code Hamiltonian over respective copies of the output quantum state; measuring components of an overlap matrix for the stabilizer operators over respective copies of the output quantum state; determining a matrix of eigenvalues and a matrix of eigenvectors using the measured components of the quantum error correcting code Hamiltonian and measured components of an overlap matrix for the stabilizer operators.

In some implementations measuring an expansion correction of a physical observable over an output quantum state of the quantum computation using the stabilizer operators in the linear combination of stabilizer operators comprises measuring respective $M_i^\dagger \Gamma M_j$ over the output quantum state to obtain corresponding measurement results, wherein $\Gamma$ represents the physical observable and $M_k$ represents a stabilizer operator.

In some implementations determining a corrected result of the quantum computation using the measured expansion correction of the physical observable and the determined values of the coefficients of the stabilizer operators in the linear combination comprises summing the measurement results, wherein each measurement result in the sum is multiplied by a respective determined coefficient.

In some implementations the result of the quantum computation comprises an expectation value of the physical observable.

In some implementations the physical observable comprises a weighted sum of Pauli operators, and wherein components of the physical observable comprise Pauli operators in the sum of Pauli operators.

In some implementations the quantum code comprises a stabilizer code, surface code, the Shor code, the Bacon-Shor code, or toric code.

In some implementations the quantum computation is performed using a noisy intermediate scale quantum computer.

In general, another innovative aspect of the subject matter described in this specification can be implemented in a method for correcting a result of a quantum computation represented by a problem Hamiltonian, the method comprising: identifying a set of known symmetry operators for the problem Hamiltonian; generating a set of expansion operators, comprising: for each symmetry operator, determining a sum between the identity operator and the symmetric operator; and multiplying the determined sums together to form a summation of terms, wherein each term in the summation is equal to a respective expansion operator; measuring matrix elements of some or all of the expansion operators in the generated set; and determining corrected values of an output of the quantum computation using the measured matrix elements.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the symmetry operators in the identified set of approximate symmetry operators comprise operators that do not commute with the problem Hamiltonian.

In some implementations the set of known symmetry operators comprise operators with two distinct eigenvalues.

In some implementations the method further comprises identifying a set of approximate symmetry operators for the problem, and wherein generating a set of expansion operators comprises: for each symmetry operator and for each approximate symmetry operators, determining a sum between the identity operator and the symmetric operator or approximate symmetry operator; and multiplying the determined sums together to form a summation of terms, wherein each term in the summation is equal to a respective expansion operator.

The subject matter described in this specification can be implemented in particular ways so as to realize one or more of the following advantages.

A system implementing the decoding techniques described in this specification can reduce errors in quantum computations to increase the accuracy of the quantum computations. For example, the presently described techniques can be used to mitigate errors and increase the accuracy of quantum computations in near-term applications of quantum computing such as quantum chemistry or general quantum circuits. In addition, the techniques described in this specification do not require strict stabilizer measurements, easing the resource and control requirements for non-local measurements, and do not require a feed-forward mechanism. The complexity of operations required to perform quantum computations with reduced errors and improved accuracy is therefore also reduced.

In addition, the presently described techniques can be used to optimize quantum codes on quantum devices to increase the performance of the quantum device. It has been conjectured that one of the best uses of early quantum devices may be to tune quantum error correcting codes under actual device conditions. The modeling of true noise within the device is incredibly difficult as the system size grows, and studying which codes excel under natural conditions and how to optimize them may lead to progress towards fully fault tolerant computation. Indeed, knowledge of biased noise sources can vastly increase the threshold of a given code. The techniques described in this specification provide a method to experimentally study the encoding through post-processing while removing the complication of fault-tolerant syndrome measurement or fast feedback. This allows for the exploration of a wider variety of codes experimentally before worrying about these final details. It is possible to run simple gate sequences in the logical space with known results, and use the post processing decoder described herein to study the decay of errors as stabilizers are added. This limit will inform the propagation of logical errors in the system and allow code optimizations to be made—before full fault tolerant protocols are available.

The decoding techniques described in this specification benefits greatly from the fact that check measurements need not be geometrically local to be implementable in a realistic setting. This allows for codes that are not geometrically local on the architecture in use to be explored and utilized, which may have improved properties with respect to distance and rate than geometrically local codes. Moreover, they naturally allow implementation of recent fermionic based codes, such as Majorana loop stabilizer codes or variations of Bravyi-Kitaev superfast thought to be good candidates for near-term simulations, without the need for complicated decoding circuits or ancilla for syndrome measurements.

Moreover, since the method proposed in this specification is a post-processing method, it is entirely compatible with extrapolation techniques introduced for error mitigation. In these techniques, additional noise is artificially introduced to extrapolate to a lower noise limit.

The method for mitigating errors and studying error correcting codes described in this specification can be implemented to achieve a pseudo-threshold of p≈0.60 under a depolarizing channel in the [[5; 1; 3]] code. The method has the potential to play a role in the development and optimization of quantum codes under realistic noise conditions as well as the ability to remove errors from early application initiatives.

The techniques described in this specification can be applied to computational problems encoded using a quantum code, but can also be generalized to non-encoded problems through the use of physical symmetries, approximate symmetries, non-commuting operators, or non-symmetries. In some cases, e.g., when they are available, physical symmetries or approximate symmetries may also be used to improve the efficiency and/or accuracy of the decoding techniques described in this specification for encoded problems, too.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Overview

This specification describes techniques for mitigating errors on quantum codes that are capable of mitigating errors on encoded logical qubits using efficient classical post-processing with no complicated syndrome measurements or additional qubits beyond those used for the logical qubits. This greatly simplifies the experimental exploration of quantum codes on near-term devices, removing the need for locality of syndromes or fast feed-forward, allowing the performance aspects of codes to be studied on real devices.

The techniques include a general construction that uses projectors from quantum error correcting codes to correct observables in post processing. This construction can also be extended to approximate projectors within a subspace. The construction then allows for a generalization to the correction of some logical errors in the code space, corrections on physical un-encoded Hamiltonians without engineered symmetries, the use of symmetries where the desired quantum number is not known, and corrections derived from approximate symmetries.

Example Hardware

Figure 1:
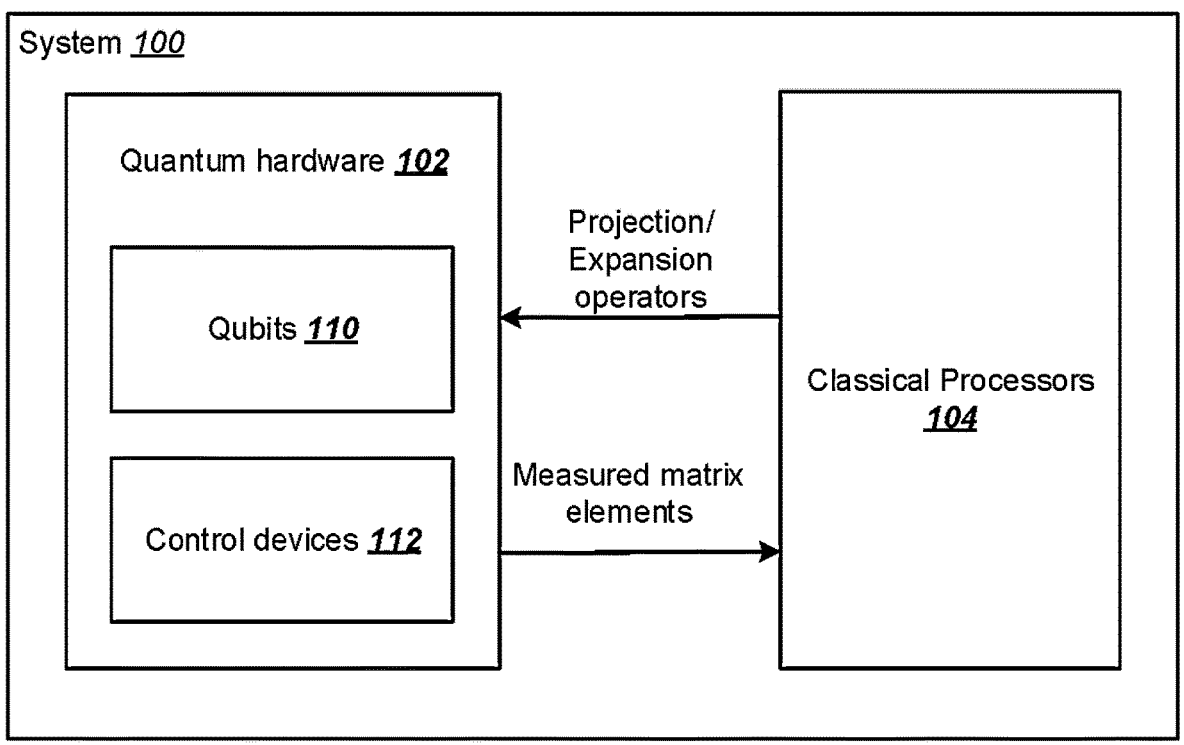
FIG. 1 depicts an example system for performing a quantum computation with reduced errors.

FIG. 1 depicts an example quantum computing system 100. The example system 100 is an example of a system implemented as classical and quantum computer programs on one or more classical computers and quantum computing devices in one or more locations, in which the systems, components, and techniques described below can be implemented.

The system 100 includes quantum hardware 102 in data communication with a classical processor 104. For convenience, the classical processor 104 and quantum computing hardware 102 are illustrated as separate entities, however in some implementations the classical processor 104 can be included in quantum computing hardware 102, e.g., the quantum computing hardware 102 can include one or more components for performing classical computing operations.

The system 100 is configured to perform classical computations in combination with quantum computations using quantum hardware 102 and classical processors 104. For example, the system may be configured to perform operations according to the example processes 200, 300 and 400 described below with reference to FIGS. 2A, 3A and 4.

The quantum hardware 102 includes multiple qubits 110 and control devices 112 for controlling the qubits 110 and causing algorithmic operations or quantum computations to be performed.

The qubits 110 are physical qubits, e.g., physical devices that behave as two-state quantum systems, that are used to perform algorithmic operations or quantum computations. Since physical qubits can be susceptible to decoherence and other sources of error, multiple physical qubits can be used to create a single logical qubit that performs as specified in a quantum algorithm or circuit. For example, in the stabilizer quantum error correcting code, logical qubits are groups of physical qubits that use redundancy through symmetry to protect information e.g., the five qubit [[5, 1, 3]] stabilizer error correcting code is a distance 3 code that encodes 1 logical qubit into 5 physical qubits and protects against arbitrary single qubit errors.

The specific physical realization of the qubits 110 included in the quantum computing hardware 102 and how they interact with one another is dependent on a variety of factors including the type of quantum computations that the quantum computing hardware 102 is performing. For example, in some implementations the qubits may include qubits that are physically realized via atomic, molecular or solid-state quantum systems. In other implementations the qubits may include superconducting qubits, e.g., Gmon qubits, or semi-conducting qubits. In other implementations ion traps, photonic devices or superconducting cavities (with which states may be prepared without requiring qubits) may be used. Further examples of physical realizations of qubits include fluxmon qubits, silicon quantum dots or phosphorus impurity qubits.

The type of control devices 112 included in the quantum hardware 102 depends on the type of qubits 110 included in the quantum hardware 102. For example, in some cases the qubits 110 can be frequency tunable. In these cases, each qubit may have associated operating frequencies that can be adjusted using one or more control devices 112, e.g., an excitation pulse generator and control lines that couple the qubits to the excitation pulse generator. Example operating frequencies include qubit idling frequencies, qubit interaction frequencies, and qubit readout frequencies. Different frequencies correspond to different operations that the qubit can perform. For example, setting the operating frequency to a corresponding idling frequency may put the qubit into a state where it does not strongly interact with other qubits, and where it may be used to perform single-qubit gates. As another example, in cases where qubits interact via couplers with fixed coupling, qubits can be configured to interact with one another by setting their respective operating frequencies at some gate-dependent frequency detuning from their common interaction frequency. In other cases, e.g., when the qubits interact via tunable couplers, qubits can be configured to interact with one another by setting the parameters of their respective couplers to enable interactions between the qubits and then by setting the qubit's respective operating frequencies at some gate-dependent frequency detuning from their common interaction frequency. Such interactions may be performed in order to perform multi-qubit gates.

The control devices 112 may further include devices, e.g., readout resonators, that are configured to perform measurements on the qubits 110 and provide measurement results to the classical processors 104 for processing and analyzing. For example, the control devices 112 may include devices configured to perform measurements of a physical observable, $\Gamma$, on one or more of the physical qubits 110. Furthermore, the control devices 112 may include devices configured to perform measurements of a projective correction of a physical observable, $P^\dagger \Gamma P$, on one or more of the physical qubits 110 based on a set of determined projection operators, as described below in relation to FIGS. 2A-4.

The classical processor 104 includes components for performing classical computation, e.g., the classical post-processing procedures described in this specification.

Programming the Hardware: Correcting Logical Observables in Post-Processing

Figure 2A:
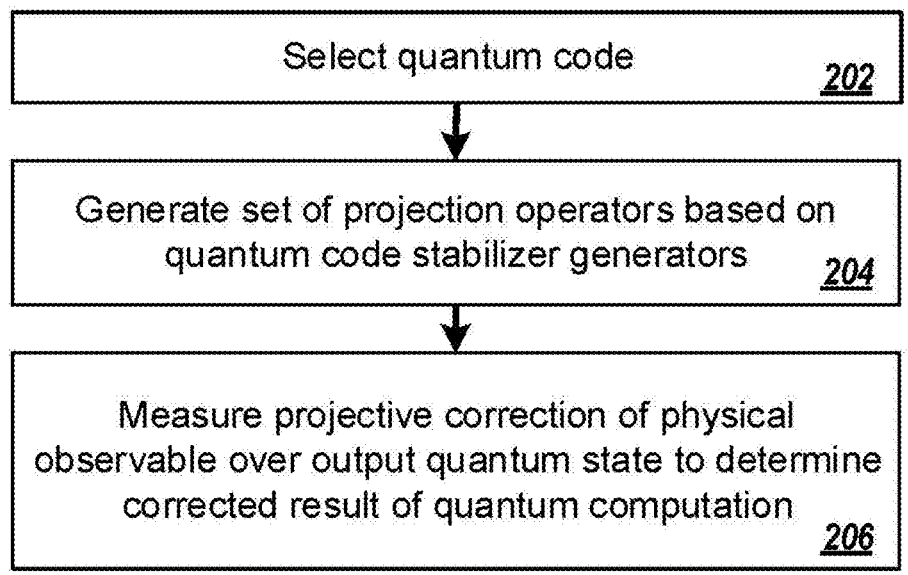
FIG. 2A is a flow diagram of a first example process for performing a quantum computation with reduced errors using stochastic subspace expansion.

FIG. 2A is a flow diagram of an example process 200 for performing a quantum computation with reduced errors using stochastic subspace expansion. For convenience, the process 200 will be described as being performed by a system of one or more classical or quantum computing devices located in one or more locations. For example, a quantum computation system, e.g., the system 100 of FIG. 1, appropriately programmed in accordance with this specification, can perform the process 200.

The system selects a quantum error correcting code to perform the quantum computation (step 202). For a system of n physical qubits, quantum error correcting codes utilize entanglement to encode a set of k<n logical qubits to improve robustness to probable errors. A code that requires at least a weight d Pauli operator to induce a logical error is said to have distance d. The three numbers n, k, d can be used to define a quantum error correcting code, with the notation [[n, k, d]]. A set of 2k logical operators formally written $\mathcal{L}=\{\overline{X}_i, \overline{Z}_i\}_{i=1, 2, \ldots k}$ perform target Pauli operations (as part of the selected error corrected code) on states in the code space, which is the ground state subspace of a code Hamiltonian corresponding to the selected quantum error correcting code. The ground state subspace of the code Hamiltonian can be given by $$\mathcal{H}_c = -\sum_{M_i \in \mathcal{M}} M_i \quad (1)$$

where $\mathcal{M}$ represents a set of check operators drawn from a stabilizer group that can be used to deduce error syndromes. More explicitly, $\mathcal{S}$ represents the set of stabilizer generators and S represents the full stabilizer group implying $\mathcal{S} \subseteq \mathcal{M} \subseteq \mathcal{S}$, such that the minimal set of check operators is the stabilizer generators, but additional operators from the stabilizer group may be added, e.g., as in single shot error correction techniques. The quantum error correcting code selected by the system can therefore be defined by the set of stabilizer generators $\mathcal{S}$.. In some implementations, the selection of the quantum error correction code may be performed by the classical processors of the system.

Example quantum codes include general stabilizer codes, surface codes, the Shor code, Bacon-Shor codes, or toric codes. Selecting the quantum code can also include selecting properties of the quantum code, e.g., how many qubits to use in the encoding or how logical errors can occur. For example, if the system selects the surface code, then the number of qubits used to encode a logical qubit (which determines the code distance) may also be selected. As another example, if the system selects the surface code, then the number of errors that have to occur in the physical system to incur a logical error may also be selected. As another example, the system may select a quantum code and a level of concatenation, i.e., how many times the code is chained together to increase robustness. Selecting a quantum code and properties if the quantum code may also determine how the physical qubits will be laid out on the quantum device. Therefore, the specific quantum code and code properties selected by the system may depend on several factors including the type, size and structure of the quantum device performing the quantum computation and the type of quantum computation being performed.

Traditional error correction proceeds by measuring the check operators, e.g., using ancillary qubits, and using resulting syndrome information to decode and recover from the error. However, in some implementations it may not be possible to perform such on-the-fly measurement, decoding, and recovery, e.g., when performing quantum computations using NISQ devices. In such implementations projection operators are used to remove errors from a quantum state.

The system determines a set of symmetry operators (step 204). The symmetry operators are determined using the stabilizer formalism and projection operators. Members of the stabilizer group $S_i \in \mathcal{S}$ have eigenvalues $\pm 1$ and can each be used to construct a respective projector $P_i = (\mathcal{S} + S_i)/2$ that removes components of the state outside the $+1$ eigenspace of the stabilizers or code space. This can be used to construct a projector that is a linear combination of symmetries (which in turn is based on a product of projection operators/projectors) to remove target errors outside the code space. However, this cannot remove logical errors made within the code space. Quantum error detection typically discards results based on syndrome measurements without using error correction. However, as described in more details below, the techniques described in this specification avoid the need for direct syndrome measurements—which can be cumbersome on geometrically local qubit layouts and are challenging to perform in a fault tolerant fashion for complex codes. In some implementations, the set of symmetry operators may be determined by the classical processors of the system.

For a stabilizer group with generators $S_i$, a complete projector can be formed from $$\prod_{S_i \in s} \frac{1}{2}(\mathbb{1} + S_i) = \sum_i M_i.$$

When taken over all the generators, the expression $\Sigma_i M_i$ is the sum of all elements of the stabilizer group with a constant coefficient, which can be fixed to $\frac{1}{2}^m$ to obtain $$\bar{P} = \bar{P}^\dagger = \prod_i^m P_i = \frac{1}{2^m} \sum_{M_i \in S} M_i \qquad (2)$$

where m represents the number of stabilizer generators used. For the case of full projection, this will be the full stabilizer group which contains $2^m$ terms. While this is generally an exponential number of terms, the number of terms is not an explicit factor in the cost when a stochastic sampling scheme is used to apply the corrections, as described in more detail below. Rather, the correction cost will depend on the volume of the state outside the code space. The group structure allows for projective correction of the density matrix $\bar{P}\rho\bar{P}^\dagger$ on a noisy intermediate-scale quantum computing device.

In other words, to generate the set of symmetry operators, the system selects a subset of m stabilizer generators, and determines, for each stabilizer generator in the selected subset, a sum (or difference) between the identity operator and the stabilizer generator. The determined sums (or differences) are then multiplied together to form a summation of terms, wherein each term in the summation is equal to a respective symmetry operator. Expansion of Equation (2) generates the set of symmetry operators. For example, if the selected subset of the set of stabilizer generators includes two stabilizer generators $S_1$, $S_2$, then the sums $(I+S_1)$ and $(I+S_2)$ are multiplied together to form the summation $(I+S_1)(I+S_2)=I+S_1+S_2+S_1S_2$ where each term I, $S_1$, $S_2$, $S_1S_2$ is equal to a respective symmetry operator $M_i$.

In some implementations the system may determine a sum as opposed to a difference between the identity operator and the stabilizer generator, as this eliminates the things in the $-1$ eigenspace of the stabilizer. However, in other implementations the system may determine the difference.

The size m of the selected subset of the set of stabilizer generators is dependent on a variety of factors. For example, the size of the selected subset may depend on a target accuracy or a target measurement and circuit repetition cost. For example, in some cases the number of terms that can be efficiently measured in real time may be limited. A larger subset will typically yield a more accurate solution, but will have a higher measurement and circuit repetition cost.

Whilst the above described symmetry operators are exponential in number, they provide several technical advantages, e.g., as opposed to traditional measurement of stabilizer generators which may not be exponential in number. Example process 200 uses transversal, destructive measurement to avoid the need for measurement syndrome qubits and associated fault-tolerant gadgets. As such, whilst stabilizer generators commute, transversal measurement of their components may not. For example, while $X_1 X_2$ and $Z_1 Z_2$ commute, measurement of $Z_1$ and $Z_2$ transversally to determine $Z_1 Z_2$ destroys the ability to recover $X_1 X_2$. The presently described techniques allow this difficulty to be bypassed through stochastic operator sampling and works with codes of arbitrary structure. This transversal measurement scheme that avoids the need for ancilla provides a relatively high pseudo threshold for a given code.

The system measures a projective correction of a physical observable over an output quantum state of the quantum computation using the determined set of symmetry operators (step 206). The measurement may be performed by control devices of the quantum hardware on one or more of the qubits of the quantum hardware. The system uses the measured projective correction of the physical observable to determine a corrected result of the quantum computation (step 208). In some implementations, the corrected result may be determined by the classical processors of the system. The corrected result may be output by the system and/or used as input for a further classical and/or quantum computation.

For example, the output of the quantum computation may be obtained by determining an expectation value $\langle \Gamma \rangle$ of a physical observable $\Gamma$. Therefore, to determine a corrected value of the output of the quantum computation, the system can perform repeated state preparation (perform the quantum computation on an initial encoded quantum state to obtain an output quantum state $\rho$) and measurement of the prepared state according to the Equations (3) and (4) below, where $\bar{P}^\dagger \Gamma \bar{P}$ represents the projective correction of the physical observable.

$$\langle \Gamma \rangle = \frac{1}{c}Tr[\bar{P}_\rho \bar{P}^\dagger \Gamma] = \frac{1}{c}Tr[\rho(\bar{P}^\dagger \Gamma \bar{P})] \qquad (3)$$

$$= \frac{1}{c2^{2m}}\sum_{ijk}\gamma_j Tr[\rho M_i^\dagger \Gamma_j |M_k]$$

-continued $$= \frac{1}{c2^m}\sum_{jk}\gamma_j Tr[\rho\Gamma_j M_k]$$

$$c = Tr[\bar{P}_\rho \bar{P}^\dagger] = Tr[\bar{P}_\rho] \quad (4)$$

In Equation (3), ρ represents the quantum state of the quantum system after the quantum computation has been performed, $\bar{P}\rho\bar{P}^\dagger$ represents the expansion in a subspace around the quantum state ρ, Γ represents a logical Hermitian operator expressed as a sum of Pauli operators $\Gamma_i$ as $\Gamma = \Sigma_i \gamma_i \Gamma_i$, the operator Γ commutes with stabilizer group elements $M_i$, and if $M_i^\dagger M_k$ is in the selected set of operators, it can be rewritten as a single sum over these operators which will be repeated.

Repeated state preparation and measurement of the prepared state according to the Equations (3) and (4) can include: selecting one or more pairs of operators, wherein each pair comprises i) a respective component of the physical observable $\Gamma_i$, and ii) a respective symmetry operator $M_i$ from the determined set of symmetry operators; for each selected pair of operators: performing the quantum computation on an initial (encoded logical) quantum state to obtain the output (encoded logical) quantum state, and measuring the selected pair of operators over the output quantum state ρ to obtain a respective measurement result. This process can be repeated multiple times to obtain averages over all the repetitions that represent measured values with a target accuracy. The respective measurement results can be summed to obtain a corrected result of the output of the quantum computation ⟨Γ⟩..

Since the expansion of the summation in Equation (3) may contain a large number of terms, a stochastic scheme for sampling the corrections that maximizes efficiency can be implemented. In particular, running down the list of terms in the expansion of the summation and measuring each one to a fixed precision may have poor scaling. Instead, a scheme that reflects the fact that if the state ρ were completely contained in the code space, the measurement of c should be 1 and have 0 variance. This means that a reasonable stochastic sampling of terms should converge quickly, be less dependent on the actual number of terms, and depend on the quality of the state ρ.

A stochastic scheme for sampling these corrections and the associated cost of doing so is as follows. Projecting the logical operator Γ into the code space of the selected error correcting code gives $$\mu_\Gamma = Tr[\bar{P}\rho\bar{P}^\dagger\Gamma] = \frac{\tilde{\gamma}}{2^m}\sum_{ij}\gamma_j Tr[\rho\Gamma_j M_j]$$

where $\Gamma = \tilde{\gamma}\Sigma_i\gamma_i\Gamma_i$ with $\Sigma_i\gamma_i=1$ and $\gamma_i \geq 0$ from absorbing signs into $\Gamma_i$. The terms on the right of this equation can be enumerated using bit strings $\chi=(\chi_1, \ldots, \chi_m)$ to give $$\mu_\Gamma = \tilde{\gamma}\sum_{\chi\in\{0,1\}^m}\sum_j \frac{\gamma_j}{2^m}\Gamma_{\chi,j}$$

where $\Gamma_{\chi,j} = Tr[\rho\Gamma_j S_\chi]$ with $S_\chi = S_1^{\chi_1} S_2^{\chi_2} \ldots S_m^{\chi_m}$. As described above, here it is assumed that each $M_j$ is a symmetry of the encoding and commutes with the computation Hamiltonian and physical observables. To sample $Tr[\rho\Gamma_j S_\chi]$ stochastically, the coefficients $\gamma_j$ of the terms are used as a normalized probability distribution. In addition, the $M_i$ can be sampled according to a uniform distribution or can be sampled according to an importance sampling scheme, where, based on a model of errors for the device, the probabilities of choosing certain symmetries $M_i$ are intelligently weighted whilst measurement outcomes are corrected for the choice. Implementing an importance sampling scheme can lower the variance (and number of required quantum experiments) without biasing the result.

An example distinction between the measurement scheme described above with reference to Equations (3)-(4) and traditional error correction/detection is that syndrome measurements are not performed, and therefore additional ancilla qubits are not required. Whilst the traditional approach advantageously uses non-destructive measurements, it also has several disadvantages—in particular for near term implementations. For example, the traditional approach usually requires both more qubits and more non-locality. As another example, the traditional approach is less effective at detecting/correcting errors and has poor pseudo-thresholds. By removing the need for these syndrome measurements, as opposed to appending an operator and measuring all qubits independently, the regime of applicability is improved. For example, less accurate gates are required for the techniques to still be effective. In other words, in the measurement scheme described above with reference to Equations (3)-(4), stabilizers are not required to be measured "in earnest" because the techniques include a post-processing procedure—information in the state can be destroyed by measuring qubit-wise across Pauli operators. As an example, if the Pauli operator $X_1 Z_2 Z_3 X_4$ is used a stabilizer, a true stabilizer measurement would require extracting only the ±1 measurement using an ancilla. However, in the presently described scheme, repeated preparations of the state can be freely used and any unbiased estimator of $\langle X_1 Z_2 Z_3 X_4\rangle$ can be constructed, including those which might destroy the encoded state. This dramatically simplifies the use of codes with non-local stabilizer measurements.

Figure 2B:
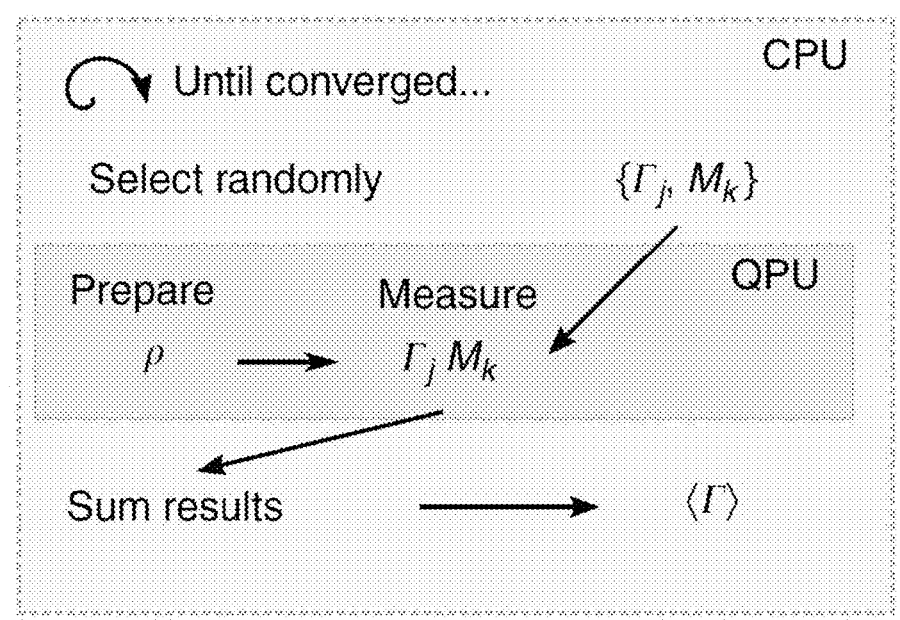
FIG. 2B shows an algorithmic schematic performing a quantum computation with reduced errors using stochastic subspace expansion.

FIG. 2B shows an algorithmic schematic 250 of the example process 200 for performing a quantum computation with reduced errors using stochastic subspace expansion. As described above, an expansion in a subspace around a prepared quantum state ρ (e.g., an initial quantum code state or an initial quantum code state that has had some sequence of quantum gates applied to it) is used to improve the expected value of the logical observable ⟨Γ⟩, without requiring ancilla based syndrome measurements or feedforward. An observable in the logical space Γ is expressed as a sum of Pauli operators, $\Gamma_k$, while symmetries, $M_k$, either naturally dictated by a system or from the stabilizer group S are selected. When using stochastic subspace expansion, terms from Equation (3) are randomly selected according to a stochastic sampling scheme, i.e., the operators $\{T_j, M_k\}$ are randomly selected according to the stochastic sampling scheme. For each selected term, the state ρ is prepared and the corresponding operators are measured using the state. The measurement results for each selected term are used to assemble the corrected expectation value ⟨Γ⟩. The random sampling ⟨of terms, measurement and summation are repeated until an obtained corrected expectation value satisfies a convergence criterion.

Programming the Hardware: Relaxing Projectors to Subspace Expansions

Figure 3A:
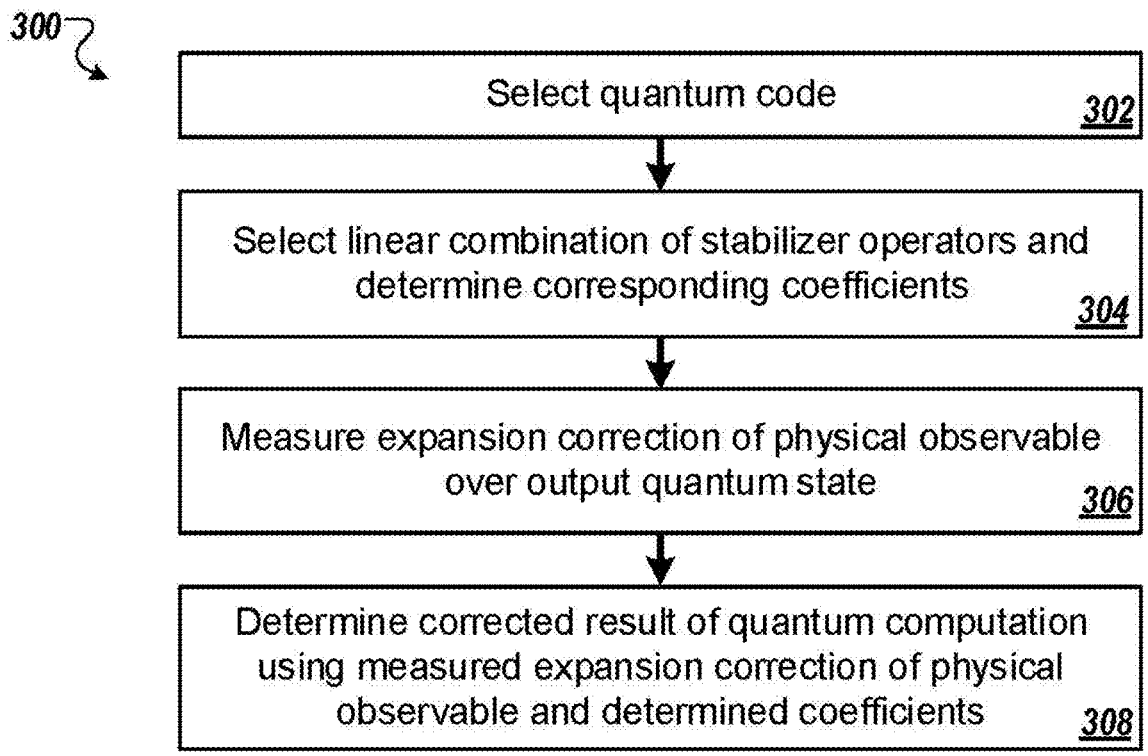
FIG. 3A is a flow diagram of an example process for performing a quantum computation with reduced errors using deterministic subspace expansion.

FIG. 3A is a flow diagram of an example process 300 for performing a quantum computation with reduced errors using deterministic subspace expansion. For convenience, the process 300 will be described as being performed by a system of one or more classical or quantum computing devices located in one or more locations. For example, a quantum computation system, e.g., the system 100 of FIG. 1, appropriately programmed in accordance with this specification, can perform the process 300.

The system selects a quantum error correcting code to perform the quantum computation (step 302). Selecting a quantum error correcting code to perform a quantum computation is described in detail above with reference to step 202 of example process 200.

The system determines a set of stabilizer operators (step 304). Determining a set of stabilizer operators is described above with reference to step 204 of example process 200. In step 204 of example process 200, the system constructs symmetry operators from quantum error correcting codes. Step 304 of example process 300 is based on step 204 of example process 200, however in step 304 the projection operator construction is relaxed based on approximations of the projection operators within a subspace (the operators used to construct the stabilizer operators do not need to strictly be projectors, or if they are projectors, they do not need to commute with the corresponding code Hamiltonian). Therefore, the projection operators are also referred to as expansion operators. This relaxation provides increased flexibility and power, because the relaxed construction minimizes errors variationally. This means the expansion operators can break a known symmetry in favor of a better solution in a respective metric, e.g., energy. For example, it may be possible to replace an unreliable qubit with a fixed value to minimize error automatically, but this is never an exact symmetry of the problem (unless the problem is trivial).

In more detail, in step 304, Equation (2) above is generalized. In Equation (2), the coefficients $c_i$ are chosen to be uniform, i.e., $c_i = \frac{1}{2^m}$. However if the series given by the RHS of Equation (2) is truncated according to a linear ansatz, this is no longer the case and the complete projector is given by the general expression:

$$\overline{P}_c = \sum_i^L c_i M_i \qquad (5)$$

where L represents the number of terms in the linear ansatz and the stabilizer operators, $M_i$ are elements of the stabilizer group as described above with reference to example process 200—however in Equation (5), unlike in Equation (2), it no longer needs to be true that $\overline{P} \propto \Pi_i(\mathcal{S}+S_i)$. Selecting a linear ansatz built from elements of the stabilizer group facilitates the inclusion of symmetries and guarantees the existence of an expansion operator for correcting observables during post processing.

Therefore, the system selects a linear ansatz by selecting a linear combination of stabilizer operators and determines values of corresponding coefficients $c_i$. For example, the system can proceed as in step 204 of example process 200 and select a subset of m stabilizer generators for the quantum error correction code. The system can then truncate the selected subset of stabilizer generators. For example, the selected subset may be truncated in order to reduce costs associated with performing measurements. This can be achieved by identifying elements in the selected subset that do not contribute to the calculation as much as other terms, and removing these identified terms from the selected subset. For example, the system can select a group of operators $M_i$ of fixed size, then iteratively: solve the generalized eigenvalue equation described below with reference to Equations (7)-(9) to determine corresponding coefficients $c_i$ for the selected group, remove operators with determined coefficients that are smaller than a predetermined threshold, e.g., smaller than $10^{-3}$, and add new operators $M_i$ to the group to generate a new group of the fixed size. This iterative process can be repeated until a group of operators with large enough coefficients is found.

The task of determining the coefficients $c_i$ can be formulated as the task of minimizing the distance to the code space subject to a normalization constraint. Using the Hamiltonian formulation of the code space, this is equivalent to approximating the ground state of the code space by $$\min_{c_i} Tr[\overline{P}_c \rho \overline{P}_c^\dagger H_c] \qquad (6)$$

$$\text{such that } Tr[\overline{P}_c \rho \overline{P}_c^\dagger] = 1$$

$$\overline{P}_c = \sum_i c_i M_i.$$

This optimization is dependent both on the state $\rho$ and choice of $H_c$ in general. From the linear ansatz and normalization constraint, this problem is equivalent to the minimization of a quadratic form on the surface of a sphere with a non-orthogonal metric. The solution to this problem is given by the solution to the generalized eigenvalue problem given in Equations (7)-(9) below.

$$HC = SCE \qquad (7)$$

$$H_{ij} = Tr[M_i^\dagger H_c M_j \rho] \qquad (8)$$

$$S_{ij} = Tr[M_i^\dagger M_j \rho] \qquad (9)$$

In Equations (7)-(9), H represents the action of the code Hamiltonian in this stabilizer projector basis, the matrix S is an overlap or metric matrix defining the subspace geometry, C represents a matrix of eigenvectors, and E represents a diagonal matrix of eigenvalues. The column of C that corresponds to the lowest value of the diagonal matrix E contains the coefficients $c_i$. In other words, the columns of C represent the eigenvectors, and the eigenvector associated with the lowest eigenvalue (e.g., ground state) has entries which represent the $c_i$. For example, if Equations (7)-(9) are solved using a solver that produces ordered eigenvectors, the coefficients are contained in the first column of C. For cases where the stabilizer operators $M_i$ are built from projectors from generators, the solutions coincide with the solutions obtained using example process 200. In other cases, an optimal solution that interpolates between different numbers of projectors in the subspace given is obtained. This type of expansion about a state can be referred to as a quantum subspace expansion (QSE). The ground state eigenvector of this $N_M \times N_M$ eigenvalue problem forms the optimal solution of the above problem within this subspace. In some cases, the optimal solution of this eigenvalue problem may not be a strict projector. However, this is not necessarily undesirable. For example, in some cases, a lower energy state may be found for a specific problem Hamiltonian that corresponds to a rotation in the logical space.

The system measures an expansion correction $\overline{P}_c^\dagger \Gamma \overline{P}_c$ of a physical observable $\Gamma$ over an output quantum state $\rho$ of the quantum computation using the stabilizer operators in the linear combination of stabilizer operators, where the physical observable corresponds to the result of the quantum computation (step 306). Measuring an expansion correction of a physical observable over an output quantum state of the quantum computation using the stabilizer operators in the linear combination of stabilizer operators includes measuring respective $M_i^\dagger \Gamma M_j$ over the output quantum state to obtain corresponding measurement results, where $\Gamma$ represents the physical observable and $M_k$ represents a stabilizer operator.

The system determines a corrected result of the quantum computation using the measured expansion correction of the physical observable and the determined values of the coefficients of the stabilizer operators in the linear combination (step 308). Determining a corrected result of an output of a quantum computation with fixed $c_i$ is described above with reference to step 206 of example process 200. For example, the system sums the measurement results obtained by measuring each $M_i^\dagger \Gamma M_j$, where each measurement result is multiplied by a respective coefficient as determined by solving the generalized eigenvalue problem. Alternatively, the system may use the determined coefficients to build a representation of an operator in the same basis defined by the expansion operator, and use it to perform further symmetry projections or improve the estimate of a logical observable.

As in conventional quantum error correction, the degeneracy of the ground state of the full code Hamiltonian prevents referencing a single state within the code space. This makes removing logical errors with the above procedure impossible. However, when considered in conjunction with a problem Hamiltonian such as that from a quantum physical system like an electronic system, it becomes possible to correct logical errors as well if the goal is to prepare an eigenstate of this Hamiltonian or minimize its energy. As an example, given a single encoded spin with a problem Hamiltonian $-\overline{Z}_i$ where the state is incorrectly found in $|\overline{1}\rangle$, by including as an expansion operator $\overline{X}$, an error in the logical space can be corrected with this procedure, as the lower energy state, $|\overline{0}\rangle$ will be detected as being in the expanded subspace.

Figure 3B:
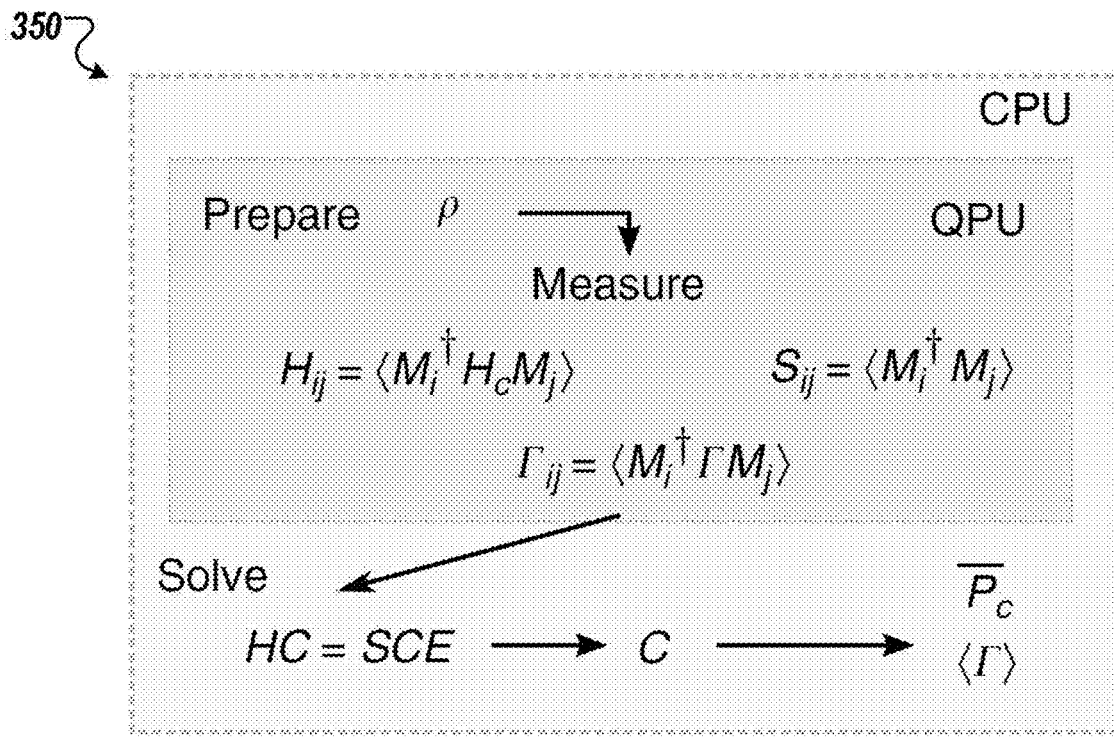
FIG. 3B shows an algorithmic schematic performing a quantum computation with reduced errors using deterministic subspace expansion.

FIG. 3B shows an algorithmic schematic 350 of example process 300 for performing a quantum computation with reduced errors using deterministic subspace expansion. As described above, an expansion in a subspace around a prepared quantum state $\rho$ is used to improve the expected value of the logical obsertable $\langle\Gamma\rangle$, without requiring ancilla based syndrome measurements or feedforward. An observable in the logical space $\Gamma$ is expressed as a sum of Pauli operators, $\Gamma_k$, while symmetries, $M_k$, either naturally dictated by a system or from the stabilizer group S are selected. When using deterministic subspace expansion, the set of $M_k$ is expanded to include non-symmetries (i.e., $\overline{P}$ is no longer necessarily proportional to $\Pi_i(S+S_i)$), and the corresponding expectation values over $\rho$ can be evaluated with many repetitions to form representations of the operators in the subspace around $\rho$. These matrices define a generalized eigenvalue problem whose solution, C, defines both an optimal projector $\overline{P}_c$ in the basis of operators $M_i$ and corrected expectation values $\langle\Gamma\rangle$ for target observables. ⟨
Programming the Hardware: Corrections with Un-Encoded Systems Example processes 200 and 300 of FIGS. 2A and 3A, respectively, describe decoding within an error correcting code that redundantly encodes quantum information via engineered symmetries. However, this strategy involves some overhead due to the encoding in the execution of gates. In some near-term experiments, it may be more practical to work directly in the space of a physical problem Hamiltonian $H_p$.

Figure 4:
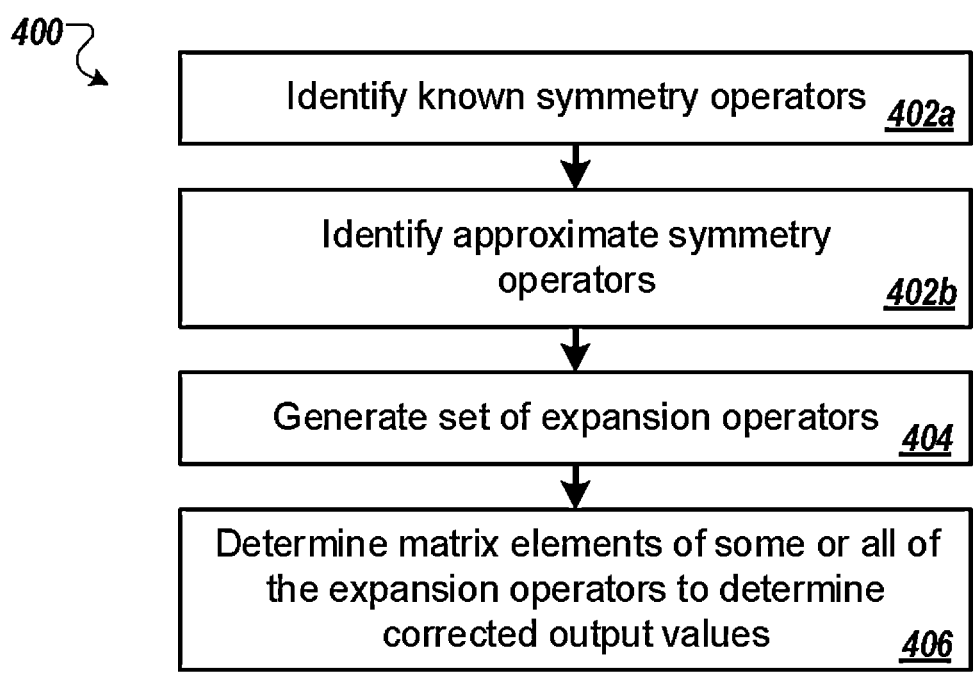
FIG. 4 is a flow diagram of an example process for performing a quantum computation in the space of a problem Hamiltonian.

FIG. 4 is a flow diagram of an example process 400 for performing a quantum computation in the space of a problem Hamiltonian. For convenience, the process 400 will be described as being performed by a system of one or more classical or quantum computing devices located in one or more locations. For example, a quantum computation system, e.g., the system 100 of FIG. 1, appropriately programmed in accordance with this specification, can perform the process 400.

The system identifies a set of known symmetry operators for the problem Hamiltonian (step 402a). These known symmetry operators may be known in advance or may be determined using special purpose algorithms. For example, in the case of an interacting fermion system, the identified set of symmetry operators can include one or more of the total number of fermions, the total spin and $S_z$ component, or symmetries related to spatial degrees of freedom in the system. In some implementations, the symmetry operators may be determined by the classical processors of the system. In some implementations, the symmetry operators may be received as and/or determined from input to the system.

In some implementations the symmetry operators in the identified set may include operators with only two distinct eigenvalues, also referred to as $\mathbb{Z}_2$ symmetries of the problem Hamiltonian. Selecting such symmetry operators can reduce the costs associated with implementing the operators. For example, the problem of number symmetry in a fermion Hamiltonian can take eigenvalues that range from 0 to the number of spin orbitals in the system. Therefore, to select the correct particle number, a projector that removes all the components except the desired particle number $N_p$ or $\propto E_{n \neq N_p}(n-\hat{N})$ where $\hat{N}$ represents the number operator on all fermionic modes of the system. This can result in a large number of terms which is expensive to implement, e.g., requiring more qubits, additional gate depth or increased computational efficiency. Example $\mathbb{Z}_2$ symmetries include the number symmetry operator, which in the Jordan-Wigner representation takes the form $\Pi_i Z_i$, or the up-spin ($\alpha$) and down-spin ($\beta$) number parities $\Pi_{i \in \alpha} Z_i$ and $\Pi_{i \in \beta} Z_i$. These operators generate the full number parity and offer additional power in their projection.

The system generates one or more projection/expansion operators (as described at step 204 of example process 200 or step 304 of example process 300) using the symmetry operators (step 404). For example, identified $\mathbb{Z}_2$ symmetries can be used in place of the stabilizer generators $S_i$ (which can generate the operators $M_i$).

In cases where the system identifies a symmetry operator at step 402a but the symmetry subspace to which the target state belongs is unknown, it will be selected automatically. For example, in the case where the system selects a $\mathbb{Z}_2$ symmetry F of the Hamiltonian $H_p$, defined by $[H_p, F]=0$, but it is not known which of the two eigenspaces the exact ground state belongs to, applying $P_F^+=(S+F)$ or $P_F^-=(S-F)$ can lead to different results. Concatenations with other symmetries can compound this problem. However, the presently described QSE procedure can automatically select between the two to find the optimal choice.

Because of this property, the system can also identify a set of approximate symmetry operators for the problem Hamiltonian or more generally operators that do not commute with the Hamiltonian but have known structure with regards to the problem at step 402a (step 402b). For example, for the local fermion occupation operator $a_i^\dagger a_i$, which under the Jordan-Wigner transformation is given by $Z_i$, it is expected that $[H_p, Z_i] \neq 0$ and for the exact state to have some component on orbital i. However, the sites in fermionic simulation problems are often approximately well-ordered in terms of both energy and likely occupation in the so-called natural orbital basis. This means that some sites are less likely to be occupied than others, and they can inflict disproportionately large energetic errors compared to similar errors on other sites. The QSE procedure can automatically decide whether to apply the projector ($S + Z_i$) by balancing the contribution of site i to the exact wavefunction against the energetic damage incurred by its extra occupation under noise in this example. While this particular projector is simple enough that it is tantamount to a removal of a qubit when applied exactly, one can imagine pair occupation projectors on the highest energy orbitals, such as ($S + Z_i Z_j$) can be effective in removing errors that caused by erroneous occupation of the highest energy orbitals which cannot be mitigated by simple truncation of a qubit.

The system determines matrix elements of some or all of the projection/expansion operators (step 406). The matrix elements may be determined by performing measurements on one or more qubits subsequent to a quantum computation being performed. The measurements may be performed by control devices of the quantum hardware on one or more of the qubits of the quantum hardware. Corrected values of an output of the quantum computation are determined using the measured matrix elements, as described above with reference to FIG. 2A and FIG. 3A.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

Elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for correcting a result of a quantum computation, the method comprising:
    selecting a quantum error correcting code to perform the quantum computation, wherein the quantum error correcting code is defined by a respective set of stabilizer generators;
    selecting a linear combination of stabilizer operators generated by the stabilizer generators;
    determining values of coefficients of the stabilizer operators in the linear combination, comprising solving a generalized eigenvalue problem for a corresponding quantum error correcting code Hamiltonian;
    measuring an expansion correction of a physical observable over an output quantum state of the quantum computation using the stabilizer operators in the linear combination of stabilizer operators, wherein the physical observable corresponds to the result of the quantum computation; and
    determining a corrected result of the quantum computation using the measured expansion correction of the physical observable and the determined values of the coefficients of the stabilizer operators in the linear combination.

2. The method of claim 1, wherein solving the generalized eigenvalue problem comprises:
   preparing multiple copies of an output quantum state of the quantum computation;
   measuring components of the quantum error correcting code Hamiltonian over respective copies of the output quantum state;
   measuring components of an overlap matrix for the stabilizer operators over respective copies of the output quantum state;
   determining a matrix of eigenvalues and a matrix of eigenvectors using the measured components of the quantum error correcting code Hamiltonian and measured components of an overlap matrix for the stabilizer operators.

3. The method of claim 1, wherein measuring an expansion correction of a physical observable over an output quantum state of the quantum computation using the stabilizer operators in the linear combination of stabilizer operators comprises measuring respective $M_i^\dagger \Gamma M_j$ over the output quantum state to obtain corresponding measurement results, wherein $\Gamma$ represents the physical observable and $M_k$ represents a stabilizer operator.

4. The method of claim 3, wherein determining a corrected result of the quantum computation using the measured expansion correction of the physical observable and the determined values of the coefficients of the stabilizer operators in the linear combination comprises:
   summing the measurement results, wherein each measurement result in the sum is multiplied by a respective determined coefficient.

5. The method of claim 1, wherein the result of the quantum computation comprises an expectation value of the physical observable.

6. The method of claim 1, wherein the physical observable comprises a weighted sum of Pauli operators, and wherein components of the physical observable comprise Pauli operators in the sum of Pauli operators.

7. The method of claim 1, wherein the quantum code comprises a stabilizer code, surface code, the Shor code, the Bacon-Shor code, or toric code.

8. The method of claim 1, wherein the quantum computation is performed using a noisy intermediate scale quantum computer.

9. An apparatus comprising:
   quantum hardware; and
   one or more classical processors;
   wherein the apparatus is configured to perform operations comprising the methods of claim 1.

* * * * *